United States Patent [19]

Cogan

[11] Patent Number: 4,786,614

[45] Date of Patent: Nov. 22, 1988

[54] METHOD OF FABRICATING A HIGH VOLTAGE SEMICONDUCTOR DEVICE HAVING A PAIR OF V-SHAPED ISOLATION GROOVES

[75] Inventor: Adrian I. Cogan, San Jose, Calif.

[73] Assignee: Siliconix Incorporated, Santa Clara, Calif.

[21] Appl. No.: 19,085

[22] Filed: Feb. 26, 1987

[51] Int. Cl.$^4$ ............................................. H01L 21/38
[52] U.S. Cl. .......................................... 437/64; 437/66; 437/68
[58] Field of Search ............................. 437/64, 66, 68

[56] References Cited

U.S. PATENT DOCUMENTS

| | | | |
|---|---|---|---|
| 3,847,687 | 11/1974 | Davidsohn | 437/66 X |
| 3,920,482 | 11/1975 | Russell | 437/68 X |
| 4,255,207 | 3/1981 | Nicolay et al. | 437/68 |
| 4,269,636 | 5/1981 | Rivoli et al. | 437/68 X |
| 4,682,405 | 7/1987 | Blanchard et al. | 437/31 X |

*Primary Examiner*—George T. Ozaki
*Attorney, Agent, or Firm*—Alan H. MacPherson; Paul J. Winters; Norman R. Klivans

[57] ABSTRACT

A method of fabricating a semiconductor device capable of handling high voltages includes forming a relatively thick epitaxial layer the top surface of which defines a plurality of generally V-shaped grooves, a pair of the grooves having formed therebetween active device regions, such pair of grooves acting as isolation regions including impurity regions extending on both sides of the groove through the epitaxial layer to a lower layer. A pair of grooves formed inward of the first-mentioned grooves contact active regions of the device into which the V-shaped portions extend, again with each such V-shaped portion having impurity regions extending on both sides thereof. The impurity regions associated with the V-shaped grooves are formed simultaneously with other active regions of the device.

2 Claims, 2 Drawing Sheets

METHOD OF FABRICATING A HIGH VOLTAGE SEMICONDUCTOR DEVICE HAVING A PAIR OF V-SHAPED ISOLATION GROOVES

BACKGROUND OF THE INVENTION

This invention relates to semiconductor devices and the fabrication thereof and more particularly, to such a device and method of formation wherein are included V-shaped grooves which are associated with isolation regions and active regions of the device.

PRIOR ART

In a typical prior art high-voltage device, a relatively thick epitaxial layer is grown on a base layer of semiconductor material, with the base layer of a first conductivity type (for example, P type), while the epitaxial layer is of a second conductivity type (for example, N type). A buried layer of N+ type may be provided between the layers as is well known.

In such a device, the epitaxial layer has a planar top surface, and a number of active regions are grouped together adjacent the top surface and set off by surrounding isolation regions. The isolation regions are of the first conductivity type and extend from the top surface of the epitaxial layer to and into the base layer. Also, some of the active device regions, for example, N+ regions formed in the epitaxial layer, extend very close to the buried layer.

Typically, these N+ and P+ regions, which extend into the base layer or close to the buried layer, are formed by diffusion, or by initial ion implantation and subsequent diffusion. In either case, because of the great thickness of the epitaxial layer, the diffusion takes a relatively long time to reach the depth desired. Also, the diffused area has a gradual profile from high to low concentration as one moves away from the surface toward the base layer, resulting in a less abrupt step in the diffused area-epitaxial layer junction than is desirable. Furthermore, with long diffusion time, it is necessary to provide a thicker epitaxial layer than is desirable, to make up for the epitaxial material used through oxidation of the material during drive-in diffusion.

The active regions which extend from the planar surface of the epitaxial layer to close to the buried layer define a path of relatively high resistance, proportional to the depth of the active layer from the planar surface of the epitaxial layer.

Besides the active regions already described as extending to close to the buried layer, other active regions may be formed which require relatively short diffusion times. These diffusion times do not correspond to the lengthy diffusion times needed to form the isolation regions and the active regions which extend close to the buried layer. Consequently, these cannot be done at the same time. Because of their different diffusion times, extra diffusion steps will be undertaken to form the device.

SUMMARY

It is an object of this invention to overcome the above-cited problems by providing a method and device wherein isolation regions require relatively short diffusion times, and result in a relatively even profile and an abrupt junction, meanwhile allowing simultaneous formation of other active regions which require the same relatively short diffusion times. Furthermore, the present invention provides for the formation of certain active regions which extend to adjacent but spaced from the buried layer of the device, with a relatively short diffusion time, which possesses a relatively even profile and an abrupt junction, meanwhile allowing simultaneous formation of other active regions requiring a short diffusion time. The active regions which extend to adjacent but spaced from the buried layer are in a reduced resistive path from the surface of the epitaxial layer to the buried layer.

Broadly stated, in accordance with the invention a semiconductor device is made by the steps of providing a first layer of semiconductor material of a first conductivity type, providing a second layer of semiconductor material of a second conductivity type opposite the first conductivity type, and on which the first layer is disposed, forming first and second generally V-shaped grooves in a surface of the first layer, masking a portion of the surface of the first layer including only one of the first and second generally V-shaped grooves (previously unmasked), introducing an impurity into the first layer simultaneously at the unmasked generally V-shaped groove and at least one remaining unmasked portion of the surface of the first layer, the impurity being of the second conductivity type and extending to the second layer, removing the masking, masking a portion of the surface of the first layer including only the other of the generally V-shaped grooves, and introducing an impurity of the first conductivity type simultaneously into the first layer at the other generally V-shaped groove and at least one remaining unmasked portion of the surface of the first layer, the masking being configured so that the impurities of the first and second conductivity types introduced into the remaining unmasked portions of the surface of the first layer define additional regions with an additional region of first conductivity type contained within another additional region of second conductivity type.

Broadly stated, in accordance with the invention a semiconductor device consisting of a first layer of a first conductivity type, a second layer of a second conductivity type opposite the first conductivity type and on which the first layer is disposed, a buried layer of enhanced conductivity type between the first and second layers, the first layer having formed in a surface thereof first and second grooves generally V-shaped, and extending from the surface of the first layer to substantially the same depth toward the second layer, a first region of said first layer, said first region being of the second conductivity type and extending from the surface of the first layer through the first layer to the second layer, the first generally V-shaped groove extending into the first region, and an active element comprising a second region of the first layer, the second region being of an enhanced first conductivity type and extending from the surface of the first layer to adjacent but spaced from the buried layer, the generally V-shaped groove extending into the second region.

BRIEF DESCRIPTION OF THE DRAWINGS

Other objects will become apparent from a study of the following specification and drawings, in which.

DESCRIPTION OF THE PREFERRED EMBODIMENT

Figure 1:
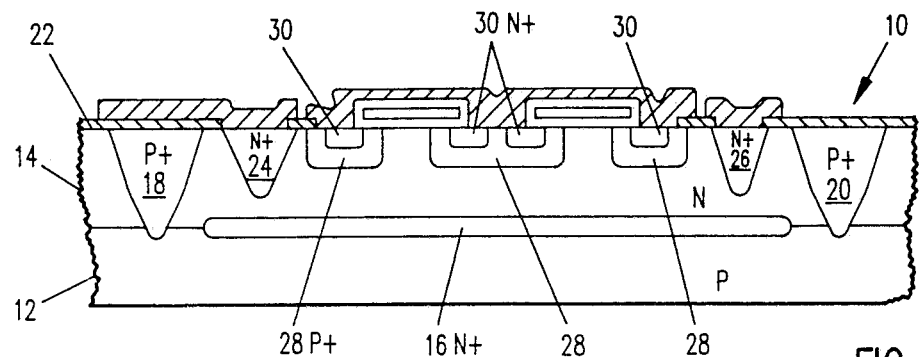
FIG. 1 is a cross-sectional view of a prior art semiconductor device.

Shown in FIG. 1 is a typical prior art semiconductor device 10 relating to the present subject matter. As shown therein, the device 10 includes a layer of semiconductor substrate 12, in this example P type, and an epitaxial layer 14 of N type conductivity grown thereon, with a buried layer 16 of N+ type conductivity formed therebetween. The device 10 includes isolation regions 18, 20 which are of P+ type conductivity, formed by diffusion, or ion implantation and subsequent diffusion, as is well known. These isolation regions 18, 20 extend from the planar surface 22 of the epitaxial layer 14 through that layer and into the substrate 12. The device 10 similarly includes N+ type regions 24, 26 which extend from the planar surface 22 of the epitaxial layer 14 to adjacent the buried layer 16 of the device 10, and act as "sinker" regions for the device 10. Further active regions 28, 30 (P+ and N+ type respectively) are shown between the regions 24, 26.

It will readily be seen that formation of the isolation regions 18, 20 will require a relatively lengthy diffusion time as compared to, for example, formation of the regions 28 of like conductivity type. The same is true in the formation of the regions 24, 26, as compared to the regions 30 of like conductivity type.

Because of the thickness of the epitaxial layer 14, with the attendant requirement of long diffusion times to achieve the deep diffusion depth required, the diffused areas 18, 20, 24, 26 have a rather gradual diffusion profile from high to low concentration, resulting in a less abrupt junction with the epitaxial layer 14 than is desirable. With such long diffusion times, it has been found necessary to provide a thicker epitaxial layer 14 than is desirable, to make up for epitaxial layer material which is used up during the oxidation taking place during the drive-in diffusion. Furthermore, because the regions 24, 26 extend from the planar surface 22 of the epitaxial layer 14 to close to the buried layer 16 (but not in actual contact with buried layer 16), a relatively long electrical path results from contact-through region 24, a portion of region 14 to buried layer 16, which in turn defines a high resistance.

Figure 2:
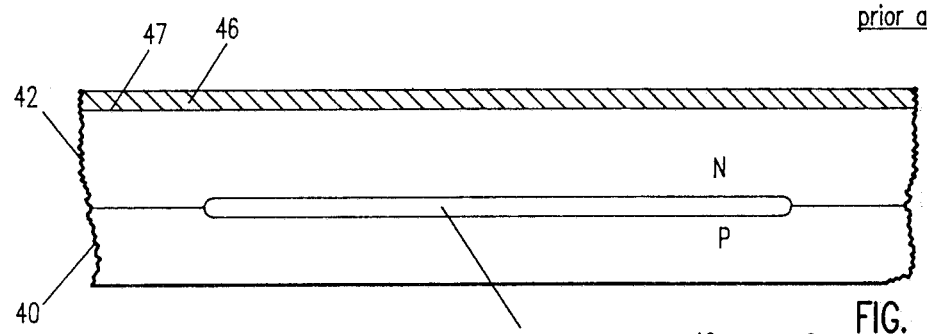
FIGS. 2-7 are sequential cross-sectional views of a semiconductor device, showing the fabrication thereof, in accordance with the present invention.

In accordance with the present invention, shown in FIG. 2 is a layer 40 of P type semiconductor material, for example silicon, having grown thereon an epitaxial layer 42 of N conductivity type, with a buried region 44 of N+ conductivity type therebetween. An oxide layer 46 is grown on the surface 47 of epitaxial layer 42 as shown.

Figure 3:
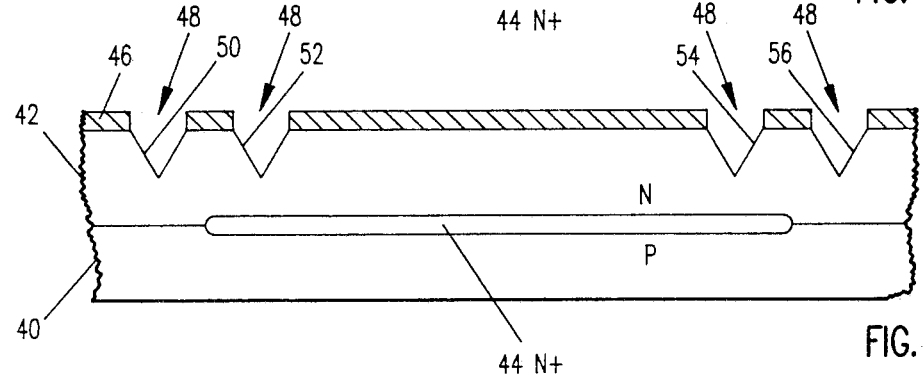

Windows 48 are opened in the oxide layer 46, and generally V-shaped grooves 50, 52, 54, 56, are anisotropically etched therein, to substantially the same depth (FIG. 3).

Figure 4:
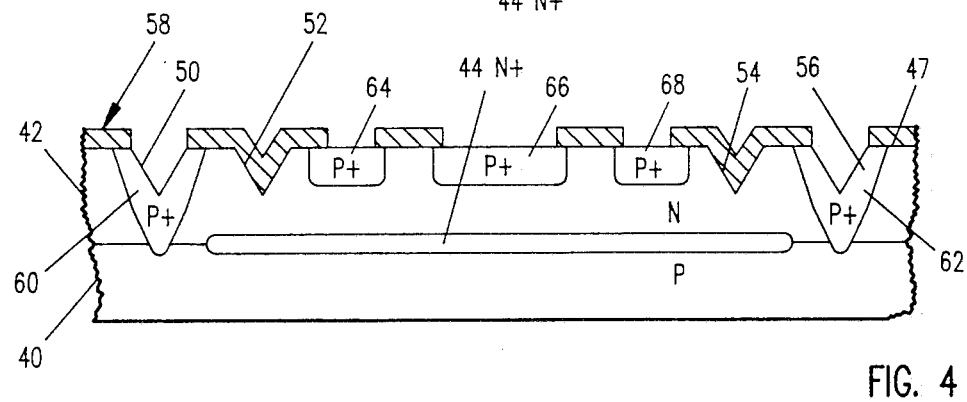

The remainder of the oxide layer 46 is removed, and another oxide layer 58 is formed (FIG. 4) and patterned on the surface 47 of the epitaxial layer 42 (FIG. 4). At this point, only outer grooves 50, 56 are unmasked (grooves 52, 54 being masked), with certain portions of the epitaxial layer 14 between the grooves 52, 54 also being masked.

A diffusion step (or an implantation and diffusion step) is now undertaken, using P type impurity. This diffusion step is undertaken long enough so that P+ type impurity diffuses into the areas of the generally V-shaped grooves 50, 56 through the epitaxial layer 42 and into the layer 40, forming P+ regions 60, 62. Simultaneously, P+ type regions 64, 66, 68, which will form part of the active regions of the device, are formed. It will be noted that because of the generally V-shaped grooves 50, 56, the diffusion step forming the isolation regions 60, 62 can be completed in a relatively short time, since the V-shaped grooves 50, 56 extend into the epitaxial layer 42 toward the layer 40. Thus, the P+ isolation regions 60, 62 and the P+ active regions 64, 66, 68 (which require a relatively short diffusion time) can be formed simultaneously in the same time.

Figure 5:
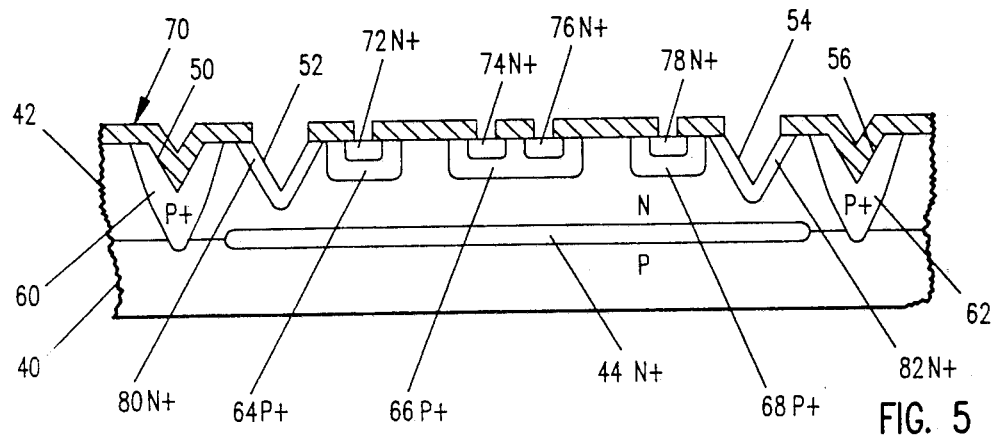

The oxide layer 58 is removed, and (FIG. 5) another oxide layer 70 is formed on the epitaxial layer 42 and patterned as shown. In this case only the grooves 52, 54 are unmasked, while the grooves 50, 56 are masked, with other portions of the epitaxial layer 42 between the grooves 52, 54 being unmasked. Another diffusion step is undertaken, in this case with N type impurity, to form N+ type regions 72, 74, 76, 78, 80, 82. Again because of the V-shaped grooves 54, a relatively short diffusion time is needed to provide the N+ type regions 80, 82 which extend close to and in spaced relation to the buried layer 44. Because of this short diffusion time, and because of the same short diffusion time needed to form N+ type areas 72, 74, 76, 78 of active regions between the V-shaped grooves 52, 54, these regions 72, 74, 76, 78 can be formed simultaneously with regions 80, 82. As shown, the N+ diffusion regions 72, 74, 76, 78 are contained within the previously formed P+ regions 64, 66, 68, and the V-shaped grooves 50, 52, 54, 56 extend into the regions 60, 80, 82, 62, respectively, from the surface 47 of the epitaxial layer 42 toward the layer 40 with each region extending from the surface 47 continuously along both sides of its respective groove.

Figure 6:
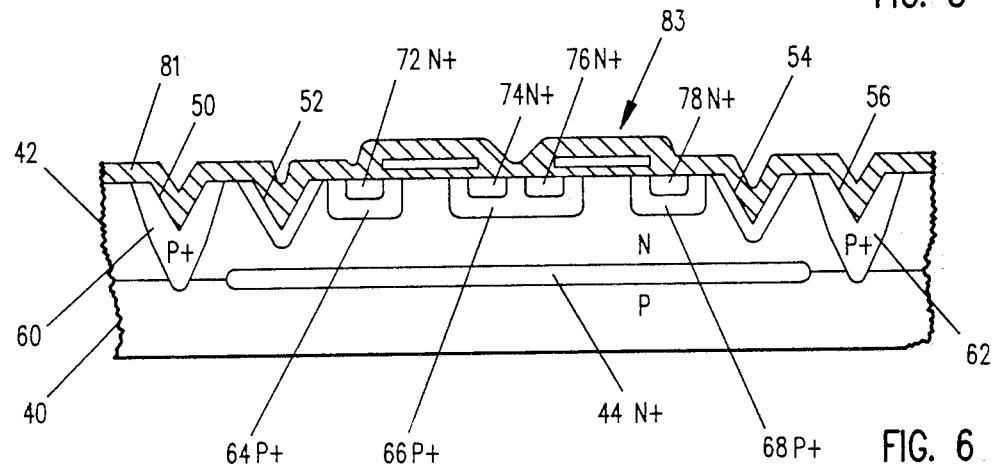
Figure 7:
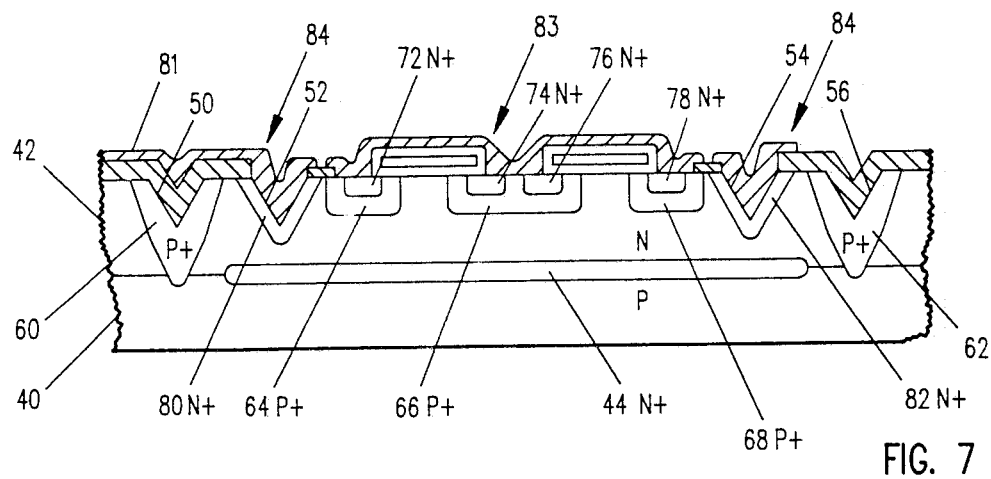

Through the rest of the process (FIGS. 6 and 7), another oxide layer 81 is provided and gate region 83 is formed. The oxide 81 is then patterned as appropriate to provide windows therein, for formation of the metal contact regions 84 for the drains and the sources of the transistors previous by formed.

In a specific embodiment, for a 100-volt device, an epitaxial layer thickness may be on the order of ten μm, while the epitaxial layer resistivity may be on the order of 0.7 ohms per centimeter.

The present invention provides for short diffusion times in the formation of the isolation regions and active regions which extend to adjacent the buried layer, because of the generally V-shaped grooves associated therewith. With such short diffusion times, short-duration diffusions as necessary of other active regions adjacent the surface of the epitaxial layer can be simultaneously undertaken. That is, the depths of the grooves 50, 56 are such that proper diffusion depth of the regions 64, 66, 68 is achieved in the same time as proper diffusion depth of the regions 50, 56. Likewise, depths of the grooves 52, 54 are such that proper diffusion depth of the regions 72, 74, 76, 78 is achieved in the same time as proper diffusion depth of the regions 52, 54.

Thus, a reduction in time necessary to fabricate the device, because of shorter diffusion times and because certain diffusions can be undertaken simultaneously, is achieved. Furthermore, because of the short diffusion times involved, a relatively even profile of the diffusion is achieved compared to the prior art, along with a clean and distinct junction between the diffused region and the area immediately adjacent it.

In forming active regions which extend close to the buried layer, the path from the surface of the epitaxial layer through the active region to the portion of the active region adjacent the buried layer is short, resulting in relatively low resistance, again because of the formation of the V-shaped grooves.

Because of the relatively short diffusion time, the epitaxial layer can be kept as thin as possible, because less epitaxial layer material is eaten up during the drive in diffusion.

It will be recognized that the invention is adaptable to both MOS and bipolar technology, through proper placement and formation of grooves in association with active regions to be formed.

I claim:

1. A method of making a semiconductor device comprising:
   providing a first layer of semiconductor material of a first conductivity tape and having a planar surface;
   providing a second layer of a semiconductor material of a second conductivity type opposite the first conductivity type, and one which the first layer is disposed;
   providing a layer of oxide having a planar surface over said first layer of semiconductor material;
   forming first and second generally V-shaped grooves in said first layer through said planar oxide surface;
   masking a portion of the first layer including only one of the first and second generally V-shaped grooves;
   introducing an impurity into the first layer simultaneously at the unmasked generally V-shaped groove and at least one remaining unmasked portion of the surface of the first layer, the impurity being of the second conductivity type and extending to the second layer;
   removing said masking;
   masking a portion of the surface of the first layer including only the other of the generally V-shaped grooves; and
   introducing an impurity of said first conductivity type simultaneously into the first layer at the unmasked generally V-shaped groove and at least one remaining unmasked portion of the surface of the first layer, the masking being configured so that the impurities of said first and second conductivity types introduced into said remaining unmasked portions of the surface of the first layer define additional regions so that one additional region of first conductivity type is contained within another additional region of second conductivity type.

2. The method of claim 1 wherein the step of introducing impurity into the first layer at the unmasked generally V-shaped groove and at least one remaining unmasked portion of the first layer provides that the introduced impurity at the unmasked generally V-shaped groove is in spaced relation to the second layer.

* * * * *

UNITED STATES PATENT AND TRADEMARK OFFICE
CERTIFICATE OF CORRECTION

PATENT NO. : 4,786,614

DATED : November 22, 1988

INVENTOR(S) : Adrian I. Cogan

It is certified that error appears in the above-identified patent and that said Letters Patent is hereby corrected as shown below:

Col. 5, line 17, "tape" should read --type--.

Col. 5, line 20, "one" should read --on--.

Signed and Sealed this

Thirty-first Day of July, 1990

Attest:

HARRY F. MANBECK, JR.

Attesting Officer

Commissioner of Patents and Trademarks